United States Patent
Burak et al.

(10) Patent No.: US 10,404,231 B2
(45) Date of Patent: Sep. 3, 2019

(54) ACOUSTIC RESONATOR DEVICE WITH AN ELECTRICALLY-ISOLATED LAYER OF HIGH-ACOUSTIC-IMPEDANCE MATERIAL INTERPOSED THEREIN

(71) Applicant: Avago Technologies General IP (Singapore) Pte. Ltd., Singapore (SG)

(72) Inventors: Dariusz Burak, Fort Collins (CO); Stefan Bader, Fort Collins, CO (US); Kevin J. Grannen, Thornton, CO (US)

(73) Assignee: Avago Technologies International Sales Pte. Limited, Singapore (SG)

(*) Notice: Subject to any disclaimer, the term of this patent is extended or adjusted under 35 U.S.C. 154(b) by 216 days.

(21) Appl. No.: 15/335,395

(22) Filed: Oct. 26, 2016

(65) Prior Publication Data

US 2017/0047907 A1     Feb. 16, 2017

Related U.S. Application Data

(63) Continuation-in-part of application No. 15/196,657, filed on Jun. 29, 2016, which is a continuation-in-part of application No. 14/192,599, filed on Feb. 27, 2014, now Pat. No. 9,571,064.

(51) Int. Cl.
  *H03H 9/17* (2006.01)
  *H03H 9/13* (2006.01)
  *H03H 9/58* (2006.01)

(52) U.S. Cl.
  CPC ............ *H03H 9/171* (2013.01); *H03H 9/132* (2013.01); *H03H 9/585* (2013.01); *H03H 9/587* (2013.01)

(58) Field of Classification Search
  CPC ........... H03H 9/17; H03H 9/171; H03H 9/132

USPC ................................................... 310/320–322
See application file for complete search history.

(56) References Cited

U.S. PATENT DOCUMENTS

| | | |
|---|---|---|
| 5,587,620 A | 12/1996 | Ruby |
| 5,873,153 A | 2/1999 | Ruby |
| 5,910,756 A | 6/1999 | Ella |
| 6,107,721 A | 8/2000 | Lakin |
| 6,262,637 B1 | 7/2001 | Bradley |
| 6,384,697 B1 | 5/2002 | Ruby et al. |
| 6,507,983 B1 | 1/2003 | Ruby et al. |
| 6,548,943 B2 | 4/2003 | Kaitila et al. |
| 6,828,713 B2 | 12/2004 | Bradley |
| 6,936,837 B2 | 8/2005 | Yamada et al. |
| 7,164,222 B2 | 1/2007 | Wang |

(Continued)

OTHER PUBLICATIONS

Notice of Allowance dated Apr. 6, 2019 for U.S. Appl. No. 15/196,657, 7 pgs.

*Primary Examiner* — Derek J Rosenau

(57) ABSTRACT

An acoustic resonator device includes a bottom electrode disposed on a substrate over an air cavity, a first piezoelectric material layer disposed on the bottom electrode, an electrically-isolated layer of high-acoustic-impedance material disposed on the first piezoelectric material layer, a second piezoelectric material layer disposed on the electrically-isolated layer of high-acoustic impedance material, and a top electrode disposed on the second piezoelectric material layer, where an overlap among the top electrode, the first piezoelectric material layer, the electrically-isolated layer of high-acoustic-impedance material, the second piezoelectric material layer, and the bottom electrode over the air cavity defines a main membrane region.

22 Claims, 9 Drawing Sheets

(56) References Cited

U.S. PATENT DOCUMENTS

| | | |
|---|---|---|
| 7,275,292 B2 | 10/2007 | Ruby et al. |
| 7,280,007 B2 | 10/2007 | Feng |
| 7,345,410 B2 | 3/2008 | Grannen et al. |
| 7,358,831 B2 | 4/2008 | Larson |
| 7,369,013 B2 | 5/2008 | Fazzio |
| 7,388,454 B2 | 6/2008 | Ruby et al. |
| 7,561,009 B2 | 7/2009 | Larson et al. |
| 7,602,102 B1 | 10/2009 | Barber et al. |
| 7,629,865 B2 | 12/2009 | Ruby et al. |
| 7,714,684 B2 | 5/2010 | Ruby et al. |
| 7,791,434 B2 | 9/2010 | Fazzio |
| 8,188,810 B2 | 5/2012 | Feng |
| 8,198,958 B1 | 6/2012 | Aigner |
| 8,230,562 B2 | 7/2012 | Fazzio |
| 8,248,185 B2 | 8/2012 | Choy |
| 8,436,516 B2 | 5/2013 | Ruby et al. |
| 8,896,395 B2 | 11/2014 | Burak et al. |
| 8,902,023 B2 | 12/2014 | Choy |
| 8,981,876 B2 | 3/2015 | Jamneala et al. |
| 9,099,983 B2 | 8/2015 | Burak et al. |
| 9,136,819 B2 | 9/2015 | Grannen et al. |
| 9,148,117 B2 | 9/2015 | Burak et al. |
| 9,197,185 B2 | 11/2015 | Zou |
| 9,225,313 B2 | 12/2015 | Bradely et al. |
| 9,243,316 B2 | 1/2016 | Larson |
| 9,246,473 B2 | 1/2016 | Burak et al. |
| 9,362,480 B2 | 6/2016 | Andosca |
| 9,444,426 B2 | 9/2016 | Burak |
| 9,571,064 B2 | 2/2017 | Burak et al. |
| 9,748,918 B2 | 8/2017 | Burak et al. |
| 9,991,871 B2 | 6/2018 | Zou et al. |
| 2007/0205850 A1 | 9/2007 | Jamneala |
| 2010/0327697 A1 | 12/2010 | Choy et al. |
| 2011/0180391 A1 | 7/2011 | Larson et al. |
| 2011/0266925 A1 | 11/2011 | Ruby |
| 2012/0177816 A1 | 7/2012 | Larson |
| 2012/0218058 A1 | 8/2012 | Burak et al. |
| 2012/0326807 A1 | 12/2012 | Choy et al. |
| 2013/0015747 A1 | 1/2013 | Ruby |
| 2013/0049545 A1 | 2/2013 | Zou |
| 2013/0106534 A1 | 5/2013 | Burak et al. |
| 2014/0111288 A1 | 4/2014 | Nikkel et al. |
| 2014/0118088 A1 | 5/2014 | Burak et al. |
| 2014/0118090 A1 | 5/2014 | Grannen |
| 2014/0118091 A1 | 5/2014 | Burak et al. |
| 2014/0132117 A1 | 5/2014 | Larson |
| 2014/0175950 A1 | 6/2014 | Zou |
| 2014/0176261 A1* | 6/2014 | Burak .................... H03H 9/132 333/187 |
| 2014/0225682 A1 | 8/2014 | Burak |
| 2014/0225683 A1 | 8/2014 | Burak et al. |
| 2014/0292150 A1 | 10/2014 | Zou |
| 2014/0354109 A1 | 12/2014 | Grannen |
| 2014/0354115 A1* | 12/2014 | Burak .................... H03H 9/175 310/348 |
| 2015/0207489 A1 | 7/2015 | Bi |
| 2015/0244347 A1 | 8/2015 | Feng |
| 2015/0311046 A1 | 10/2015 | Yeh |
| 2015/0318837 A1* | 11/2015 | Zou .................... H03H 9/02102 333/187 |
| 2015/0349747 A1 | 12/2015 | Burak et al. |
| 2016/0126930 A1 | 5/2016 | Zou et al. |
| 2017/0047907 A1 | 2/2017 | Burak et al. |
| 2018/0085787 A1 | 3/2018 | Burak et al. |

* cited by examiner

ACOUSTIC RESONATOR DEVICE WITH AN ELECTRICALLY-ISOLATED LAYER OF HIGH-ACOUSTIC-IMPEDANCE MATERIAL INTERPOSED THEREIN

CROSS REFERENCE TO RELATED APPLICATIONS

This application is a continuation-in-part under 37 C.F.R. § 1.53(b) of commonly owned U.S. patent application Ser. No. 15/196,657 to Burak et al. entitled "Acoustic Resonator Device With At Least One Air-Ring And Frame," filed on Jun. 29, 2016 (now published as U.S. Patent Application Publication No. 2016/0308509) and is a continuation-in-part of commonly owned U.S. patent application Ser. No. 14/192,599 to Burak et al. entitled "Acoustic Resonator Device With At Least One Air-Ring And Frame," filed on Feb. 27, 2014 (now published as U.S. Patent Application Publication No. 2014/0176261), which is a continuation-in-part of commonly owned U.S. patent application Ser. No. 13/151,631 to Burak et al. entitled "Film Bulk Acoustic Resonator Comprising a Bridge," filed on Jun. 2, 2011 (now issued as U.S. Pat. No. 9,203,374), which is a continuation-in-part of commonly owned U.S. patent application Ser. No. 13/074,262 to Burak et al., entitled "Stacked Acoustic Resonator Comprising a Bridge," filed on Mar. 29, 2011 (now issued as U.S. Pat. No. 9,136,818), which is a continuation-in-part of commonly owned U.S. patent application Ser. No. 13/036,489 to Burak, entitled "Coupled Resonator Filter Comprising Bridge" filed on Feb. 28, 2011 (now issued as U.S. Pat. No. 9,154,112), which are hereby incorporated by reference in their entireties. This application is a continuation-in-part under 37 C.F.R. § 1.53(b) of commonly owned U.S. patent application Ser. No. 13/660,941 to Burak et al. entitled "Acoustic Resonator having Composite Electrodes with Integrated Lateral Features," filed on Oct. 25, 2012, (now issued as U.S. Pat. No. 9,425,764), which is hereby incorporated by reference in its entirety.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric material layer between a bottom (first) electrode and a top (second) electrode over a cavity. BAW resonators may be used in a wide variety of electronic applications, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material with layers structurally attached to each other, and the peripheral regions are defined as areas outside the main membrane region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of acoustic energy confined in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the structural discontinuities located at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, an air bridge may be formed under the top electrode on the top electrode connecting edge of the acoustic resonator in order to eliminate the transducer effect over the substrate. In another example, a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has a number of potential shortcomings. For instance, depending on their specific design, they may be a source of additional scattering of the piston mode which may outweigh their benefits. Also, some design choices may produce only modest performance improvements while significantly driving up cost. Moreover, the formation of ancillary structural features may degrade structural stability or interfere with the formation of overlying layers.

In addition, conventional FBARs rely on an air interface being present both on bottom and top side of the resonator. In contrast to SMRs, an air interface present on the bottom side of the resonator prevents parasitic acoustic energy leakage to the substrate and therefore improves the overall electrical performance of FBARs without the complexities associated with the design of a wide-band, solid-state acoustic mirror such as Distributed Bragg Reflector. On the other hand, however, lack of a solid connection of the active portion of the resonator with the substrate results in worse heat removal capabilities and weaker structural stability as compared to conventional SMR designs. Accordingly, in view of these and other shortcomings of conventional FBARs, there is a general need for improved acoustic resonator designs that address these issues without compromising the electrical performance of acoustic resonators and filters comprising these resonators.

There is also a need for acoustic resonator designs enabling construction of RF filters that have better insertion loss (IL) performance for particular frequencies or frequency ranges. FIG. 1 is an idealized plot 2 of IL as a function of frequency for an RF filter comprising a typical state-of-the-art FBAR. FIG. 2 is a general, cross-sectional view of a typical state-of-the-art FBAR 5 comprising a bottom electrode 6 disposed on a substrate 7 over an air cavity 8, a piezoelectric material layer 9 disposed on the bottom electrode 6, and a top electrode 11 disposed on the piezoelectric material layer 9. The bottom electrode is terminated with the planarization layer 10. An overlap among the top electrode 11, the piezoelectric material layer 9, the bottom electrode 6, and the air cavity 8 defines a main membrane region of the FBAR 5. Air gaps 12 and 13 exist between the top electrode 11 and the piezoelectric material layer 9 at the edges of the main membrane region. The air gaps 12 and 13 form an air bridge 14 and an air wing 15, respectively. The bottom and top electrodes 6 and 11, respectively, are often made of molybdenum (Mo) and the piezoelectric material layer 9 is often made of aluminum nitride (AlN). With reference to FIG. 1, the right shoulder 3 of the plot 2 is higher and has steeper roll-off than the left should 4 of the plot 2 due to the quality factor $Q_P$ at the parallel resonance frequency $F_P$ of the FBAR 5 being three to four times better than the average quality factor $Q_{SW}$ at frequencies below series resonance frequency $F_S$ of the FBAR 5. The FBAR 5 experiences degradation of the quality factor $Q_{SW}$ for frequencies below the $F_S$ due to so-called rattles in the frequency response. The rattles are caused by the excitation of parasitic lateral resonances in the FBAR 5, which detrimentally impact the main resonance of the FBAR 5. A need exists for acoustic resonator devices that provides improved quality factor $Q_{SW}$ for frequencies below $F_S$ yielding improved left-shoulder IL performance of RF filters comprising such acoustic resonator devices.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 6 is a cross-sectional view of the acoustic resonator device shown in FIG. 3 taken along line A-A' in accordance with another representative embodiment.

DETAILED DESCRIPTION

Figure 1:
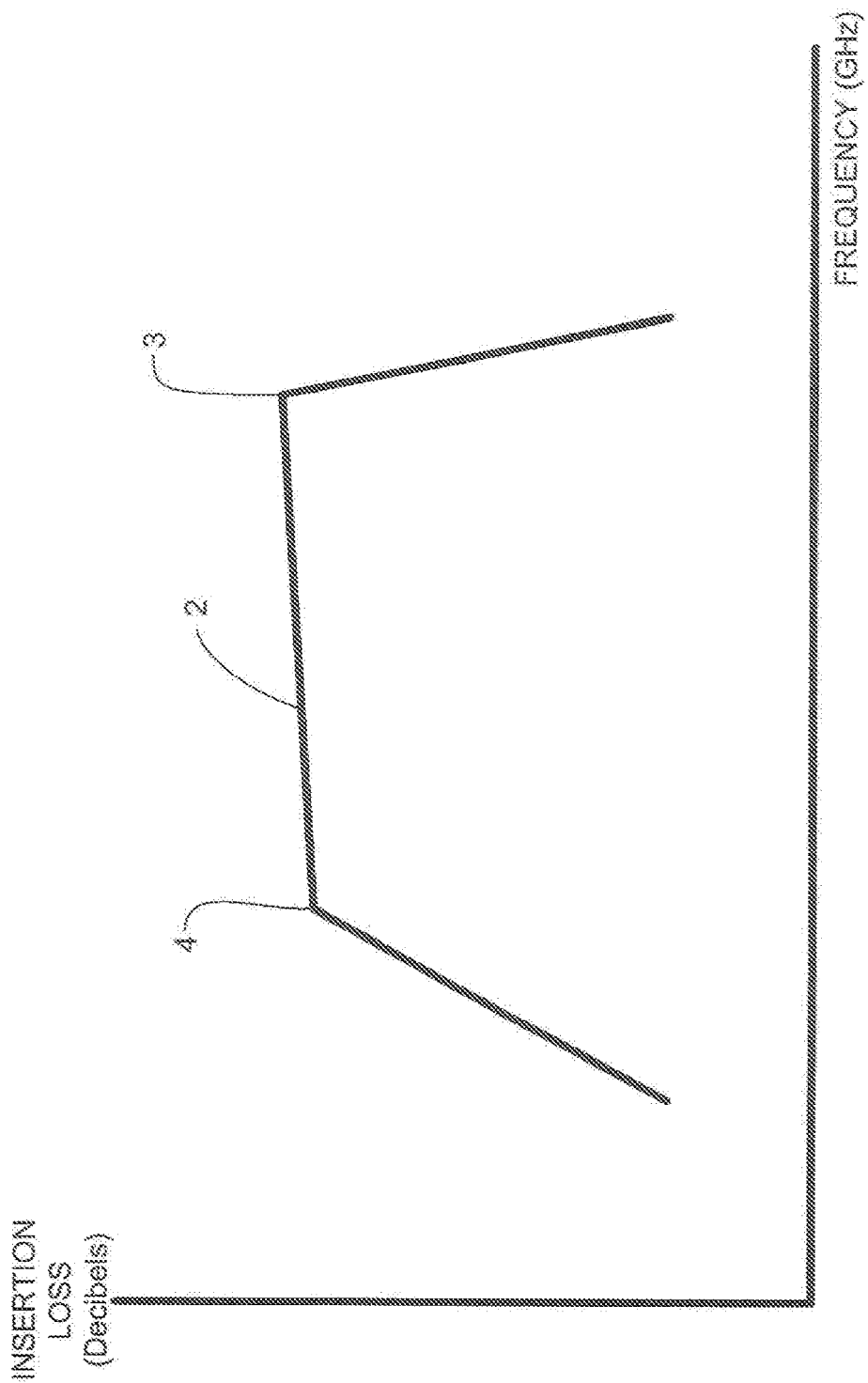
FIG. 1 is an idealized plot of insertion loss as a function of frequency for an RF filter comprising a known FBAR.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), for example. For simplicity of explanation, several embodiments are described in the context of FBAR technologies; however, the described concepts can be adapted for use in other types of acoustic resonators. When connected in a selected topology, a plurality of the resonators can act as an electrical filter. For example, the acoustic resonators may be arranged in a ladder-filter or lattice-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers (diplexers, triplexers, quadplexers, quintplexers, etc.).

A variety of devices, structures thereof, materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,714,684, and 8,436,516 to Ruby et al.; U.S. Pat. Nos. 7,369,013, 7,791,434, and 8,230,562 to Fazzio, et al.; U.S. Pat. Nos. 8,188,810, and 7,280,007 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009, 7,358,831, 9,243,316 to Larson, III et al.; U.S. Pat. No. 9,197,185 to Zou, et al., U.S. Patent Application Publication No. 20120326807 to Choy, et al.; U.S. Pat. No. 7,629,865 to Ruby; U.S. Patent Application Publications Nos. 20110180391, and 20120177816 to Larson III, et al.; U.S. Patent Application No. 20140132117 to Larson III; U.S. Patent Application Publication No. 20070205850 to Jamneala et al.; U.S. Patent Application Publication No. 20110266925 to Ruby, et al.; U.S. Patent Application Publication No. 20130015747 to Ruby, et al.; U.S. Patent Application Publication No. 20130049545 to Zou, et al.; U.S. Patent Application Publication No. 20140225682 to Burak, et al.; U.S. Patent Publication Nos.: 20140118090 and 20140354109 to Grannen, et al.; U.S. Patent Application Publication Nos. 20140292150, and 20140175950 to Zou, et al.; U.S. Patent Application Publication No. 20150244347 to Feng, et al.; U.S. Patent Application Publication 20150311046 to Yeh, et al.; and U.S. Patent Application Publication 20150207489 to Bi, et al. The entire disclosure of each of the patents, and patent application publications listed above are hereby specifically incorporated by reference herein. The disclosures of these patents and patent applications are hereby specifically incorporated by reference in their entireties. It is emphasized that the components, materials and method of fabrication described in these patents and patent applications are representative and that other methods of fabrication and materials within the purview of one of ordinary skill in the art are contemplated.

In a representative embodiment, an acoustic resonator device includes a bottom electrode disposed on a substrate over an air cavity, a first piezoelectric material layer disposed on the bottom electrode, an electrically-isolated layer of high-acoustic-impedance material disposed on the first piezoelectric material layer, a second piezoelectric material layer disposed on the electrically-isolated layer of high-acoustic impedance material, and a top electrode disposed on the second piezoelectric material layer, where an overlap among the top electrode, the first piezoelectric material layer, the electrically-isolated layer of high-acoustic-impedance material, the second piezoelectric material layer, and the bottom electrode over the air cavity defines a main membrane region. This configuration of the acoustic resonator device allows for left-shoulder IL performance improvements of an RF filter comprising these resonator devices. As will be described below in more detail, this configuration of the acoustic resonator device allows it to have a thickness extensional (TE) resonant frequency at the $n^{th}$ harmonic, $f_{TEn}$, that is greater than the thickness shear (TS) resonant frequency at the $(n+1)^{th}$ harmonic, $f_{TSn+1}$, which is referred to herein as "Type-1 resonance." This is in contrast to the typical state-of-the-art FBAR 5 shown in FIG. 2, which can be characterized as having a resonance defined by $f_{TSn+1} > f_{TEn}$, which is referred to herein as "Type-2 resonance". The importance of the distinction is described below in more detail. Notably, an RF filter comprising the typical state-of-the-art FBAR 5 would have the IL performance shown in FIG. 1.

In accordance with one representative embodiment, the acoustic resonator device further includes a temperature compensating layer disposed in the bottom electrode. In accordance with another representative embodiment, the acoustic resonator device further includes a temperature compensating layer disposed in the top electrode. Including the temperature compensating layer in the top or bottom electrode minimizes, or at least reduces, the temperature sensitivity of the frequency response of the acoustic resonator device. For most materials (including materials used to form the electrode layers and the piezoelectric material layer of the typical state-of-the-art FBAR 5 shown in FIG. 2, for example), the increase in the temperature of the materials causes a decrease of the sound velocity in these materials and the resulting decrease of the series resonance frequency of the acoustic resonator device. The increase in temperature of the acoustic resonator device may occur due to an increase in ambient temperature (e.g., from heating up of the battery in a mobile phone) or due to self-heating of a TX-filter at high RF powers delivered by the power amplifier, for example. As a result, an RF filter comprising such acoustic resonator devices would exhibit a shift of the passband towards lower frequencies. In some cases, such a passband shift may be undesirable, e.g., for Band 13 filters where the public safety band is located directly at frequencies below the frequencies allocated to Band 13. In such cases, immunizing the frequency response of an RF filter to changes in the temperature becomes a considerable design concern, as will be appreciated by one skilled in the art. In accordance with other representative embodiments, one or more metal frames may be formed on the top surface of the top electrode and one or more air bridges and/or air rings may be formed between the top electrode and the second piezoelectric material layer.

Figure 3:
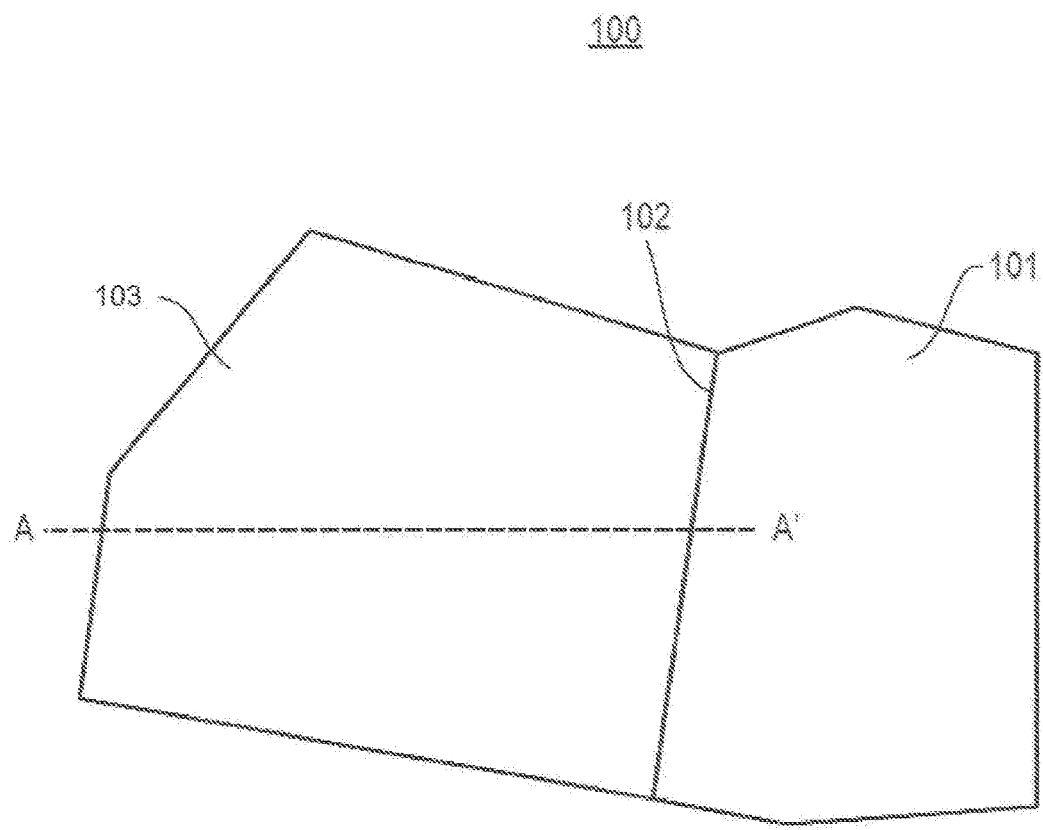
FIG. 3 is a top view of an acoustic resonator according to a representative embodiment.

FIG. 3 is a top view of an acoustic resonator 100 according to a representative embodiment, and FIGS. 6-9 are cross-sectional views of acoustic resonator 100, taken along a line A-A', according to different embodiments. The cross-sectional views correspond to different variations of acoustic resonator 100 and will be referred to, respectively, as acoustic resonators 100A-100D. Acoustic resonators 100A-100D have many of the same features, so a repetitive description of these features may be omitted in an effort to avoid redundancy.

Acoustic resonator 100 comprises a top electrode 103 having five (5) sides, with a connection side 101 configured to provide an electrical connection to interconnect 102. Interconnect 102 provides electrical signals to top electrode 103 to excite desired acoustic waves in a piezoelectric material layer (not shown in FIG. 3) of acoustic resonator 100.

The five sides of top electrode 103 have different lengths, forming an apodized pentagon shape. In alternative embodiments, top electrode 103 may have a different number of sides. Although not shown in the drawings, other embodiments of acoustic resonators, such as those of FIGS. 6-9, may have an appearance similar or identical to that of FIG. 3 when viewed from the top.

During illustrative operation of the acoustic resonator device 100A (e.g., as a part of a ladder filter), an input electrical signal is applied to an input terminal of bottom electrode 106 and top electrode 103 is connected to the output terminal. The input electrical signal typically comprises a time-varying voltage that causes vibration in the main membrane region. This vibration in turn produces an output electrical signal at an output terminal of top electrode 103. The input and output terminals may be connected to bottom and top electrodes 106 and 103 via connection edges that extend away from the main membrane region. The input and output terminals of acoustic resonator device 100A may be connected to appropriate terminals of other acoustic resonators forming the ladder filter, for instance.

Figure 2:
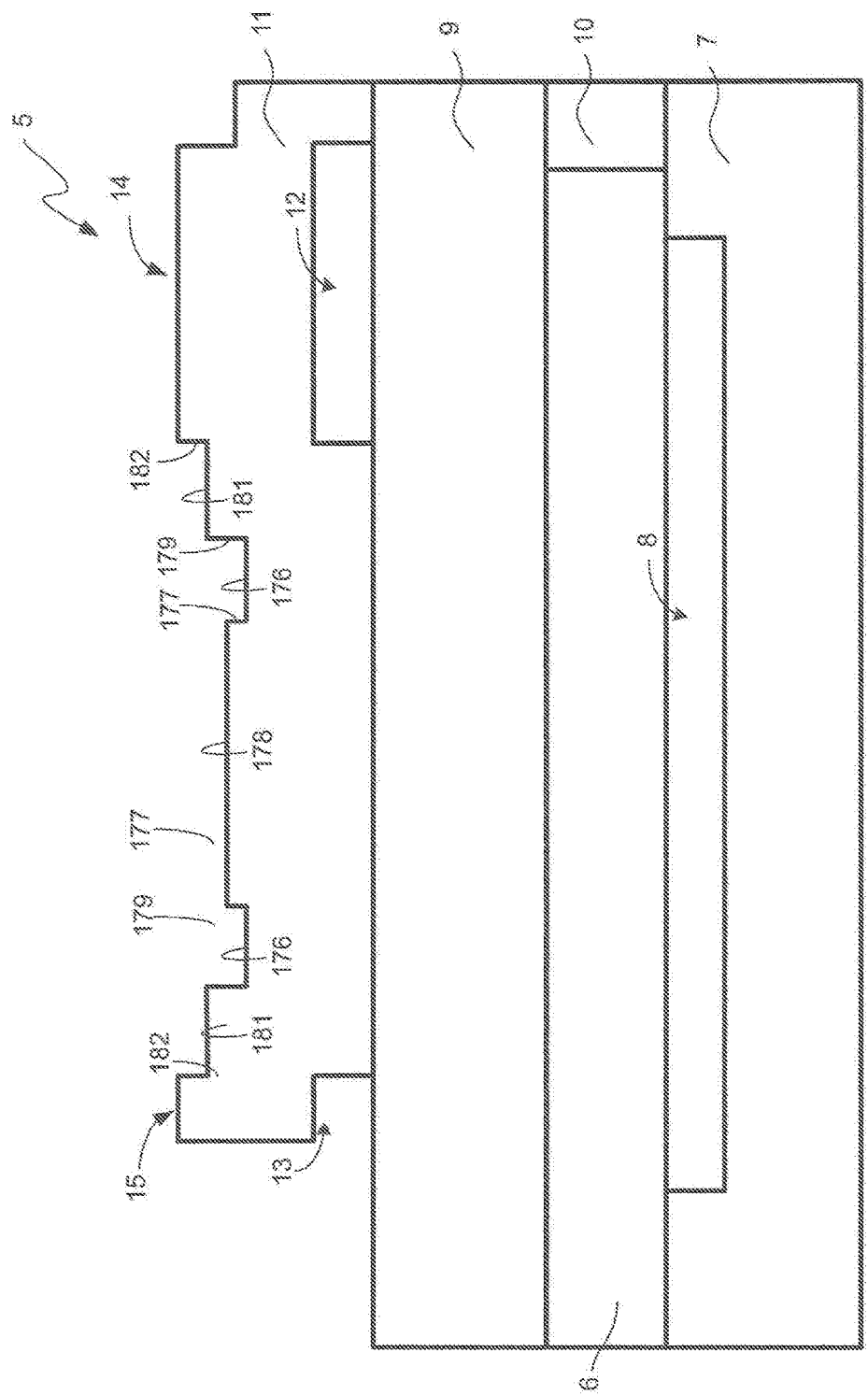
FIG. 2 is a top view of an acoustic resonator according to a representative embodiment.
Figure 4:
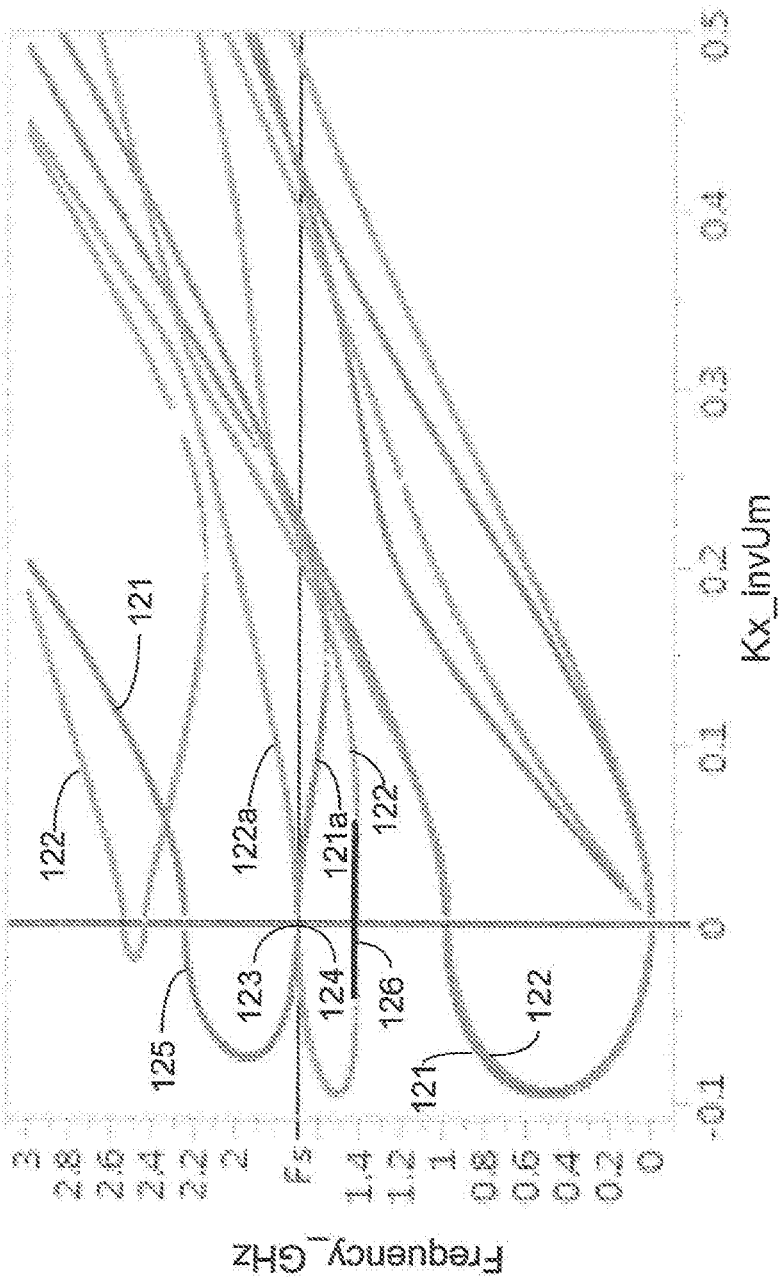
FIG. 4 is an acoustic dispersion diagram illustrating simulated vibrational modes at different frequencies of the FBAR 5 shown in FIG. 2 having Type-2 resonance and of the acoustic resonator device 100 shown in FIG. 3 having Type-1 resonance in accordance with representative embodiments described herein.

FIG. 4 is an acoustic dispersion diagram illustrating simulated vibrational modes at different frequencies of the FBAR 5 shown in FIG. 2 having Type-2 resonance and of the acoustic resonator device 100 shown in FIG. 3 having Type-1 resonance in accordance with representative embodiments described herein. The horizontal axis corresponds to the lateral wave-number Kx, with positive numbers indicating real Kx values and negative numbers indicating imaginary Kx values. The vertical axis corresponds to frequency in Gigahertz (GHz). The frequency $F_S$ on the vertical axis corresponds to the resonant frequency at the first harmonic resonance for both the FBAR 5 and the acoustic resonator device 100. Each point in FIG. 4 corresponds to an eigen-mode of specific acoustic polarization and direction of propagation supported by the acoustic stack. Real Kx values indicate that a given mode is a propagating one (e.g., it may propagate in a periodic fashion from a point of excitation) while imaginary Kx values indicate that a given mode is an evanescent one (e.g., it may decay exponentially from a point of excitation).

The curves labeled 121 and 122 correspond to the simulated vibrational modes of the FBAR 5 and of the acoustic resonator device 100, respectively, shown in FIGS. 2 and 3, respectively. The points 123 and 124 correspond to the TE resonant frequencies at the first harmonic, $f_{Te1}$, for the FBAR 5 and for the acoustic resonator device 100, respectively. The point 125 corresponds to the TS resonant frequency at the second harmonic, $f_{TS2}$, for the FBAR 5. The point 126 corresponds to the TS resonant frequency at the second harmonic, $f_{TS2}$, for the acoustic resonator device 100. As indicated above, Type-2 resonance, as that term has been defined above, means that $f_{TSn+1}>f_{TEn}$. FBAR 5 exhibits Type-2 resonance, as evidenced in FIG. 4 by point 125 of curve 121 being above point 123 of curve 121, i.e., $f_{TS2}>f_{TE1}$. Type-1 resonance, as that term has been defined above, means that $f_{TEn}>f_{TSn+1}$. Acoustic resonator device 100 exhibits Type-1 resonance, as evidenced in FIG. 4 by point 124 being above point 126, i.e., $f_{TE1}>f_{TS2}$.

The dispersion diagram shown in FIG. 4 also demonstrates that the FBAR 5 experiences degradation in performance below $F_S$ and that the acoustic resonator device 100 experiences degradation in performance above $F_S$. The portion of the curve 121 between points 123 ($f_{TE1}$) and 125 ($f_{TS2}$) has negative wave-numbers Kx, which indicates evanescent modes that decay exponentially from the point of excitation. Similarly, the portion of the curve 122 between points 124 ($f_{TE1}$) and 126 ($f_{TS2}$) has negative wave-numbers Kx indicating evanescent modes that decay exponentially from the point of excitation. These portions of the curves 121 and 122 indicate that the Type-2 and Type-1 resonance, respectively, of the FBAR 5 and of the acoustic resonator device 100, respectively, result in good performance above and below $F_S$, respectively. Conversely, the portions 121a and 122a of the curves 121 and 122, respectively, indicate that the Type-2 and Type-1 resonance, respectively, of the FBAR 5 and of the acoustic resonator device 100, respectively, result in poor performance below and above $F_S$, respectively. Thus, the acoustic resonator device 100 has good performance below $F_S$ at the expense of poorer performance above $F_S$. However, in many applications, the tradeoff is acceptable, especially in cases where one of the primary goals is to improve performance below $F_S$.

Generally, so called rattles in the resonator electrical response are caused by excitation of a propagating thickness extensional mode (with positive wave-number Kx) at the edge of the top electrode for driving frequencies below series resonance frequency Fs of Type-II and for driving frequencies above series resonance frequency Fs of Type-I. For Type-II resonance, the evanescent mode (so called eTE1-eigenmode) above series resonance frequency Fs corresponds to propagating mode (so called pTE1-eigenmode) below series resonance frequency Fs. In a typical FBAR (i.e., an FBAR having the configuration shown in FIG. 2), the total motion at the top electrode edge is suppressed due to the fact that the field region (defined as a region directly outside of the top electrode) is far-off resonance as compared to the main membrane region. For a driving frequency below the series resonance frequency Fs, that suppression of the total motion at the top electrode edge is accomplished by excitation of propagating thickness extensional pTE1-eigenmode in opposite phase to the electrically excited Mason pseudo-mode.

However, since pTE1-eigenmode supports both longitudinal and shear components, and the electrically-excited Mason pseudo-mode is purely longitudinal, therefore generally only a partial suppression of the total motion at the electrode edge can be accomplished. For example when the shear component of pTE1-eigenmode forms nodes (nulls) at the edges of the top electrode (as determined by the lateral extension of the active region and dispersion diagram for stack eigenmodes), a close to complete suppression of total motion may occur and the radiative loss is minimized. However, when shear component of pTE1-eigenmode forms anti-nodes (attains maximum values) at the edges of the top electrode, a suppression of total motion cannot occur and the radiative loss is maximized by excitation of additional propagating modes supported by the stacks on both sides of top electrode edge. At the frequency corresponding to maximum radiative loss (or anti-nodes of the pTE1-eigenmode shear components at the top electrode edges), the so called rattle is formed in the Smith-chart indicating enhanced radiative loss and significantly lowered quality factor Q of the acoustic resonator device at that frequency. In other words, a rattle is manifested in the Smith-chart as a loop or an indentation where the scattering parameter S significantly deviates from the unit circle, as will be appreciated by one skilled in the art. On the other hand, for a driving frequency above the series resonance frequency Fs, that suppression of the total motion at the top electrode edge is accomplished by excitation of the evanescent thickness extensional eTE1 mode in opposite phase to the electrically-excited Mason pseudo-mode. Since the eTE1 mode decays exponentially with distance away from the top electrode edge, it does not cause formation of standing waves (in the lateral direction) responsible for rattle formation described above for driving frequencies below Fs. Therefore, for Type-II resonances the quality factor Qp at the parallel resonance frequency Fp is three to four times larger than the average quality factor Qsw evaluated for frequencies below the series resonance frequency Fs. For Type-I resonances, the whole situation is reversed in a sense that the eTE1-(pTE1-eigenmode is mechanically excited at the top electrode edge for driving frequencies below (above) the series resonance frequency Fs, resulting in rattle formation above Fs and average quality factor Qsw being three to four times higher than the quality factor Qp at the parallel resonance frequency Fp.

Figure 5:
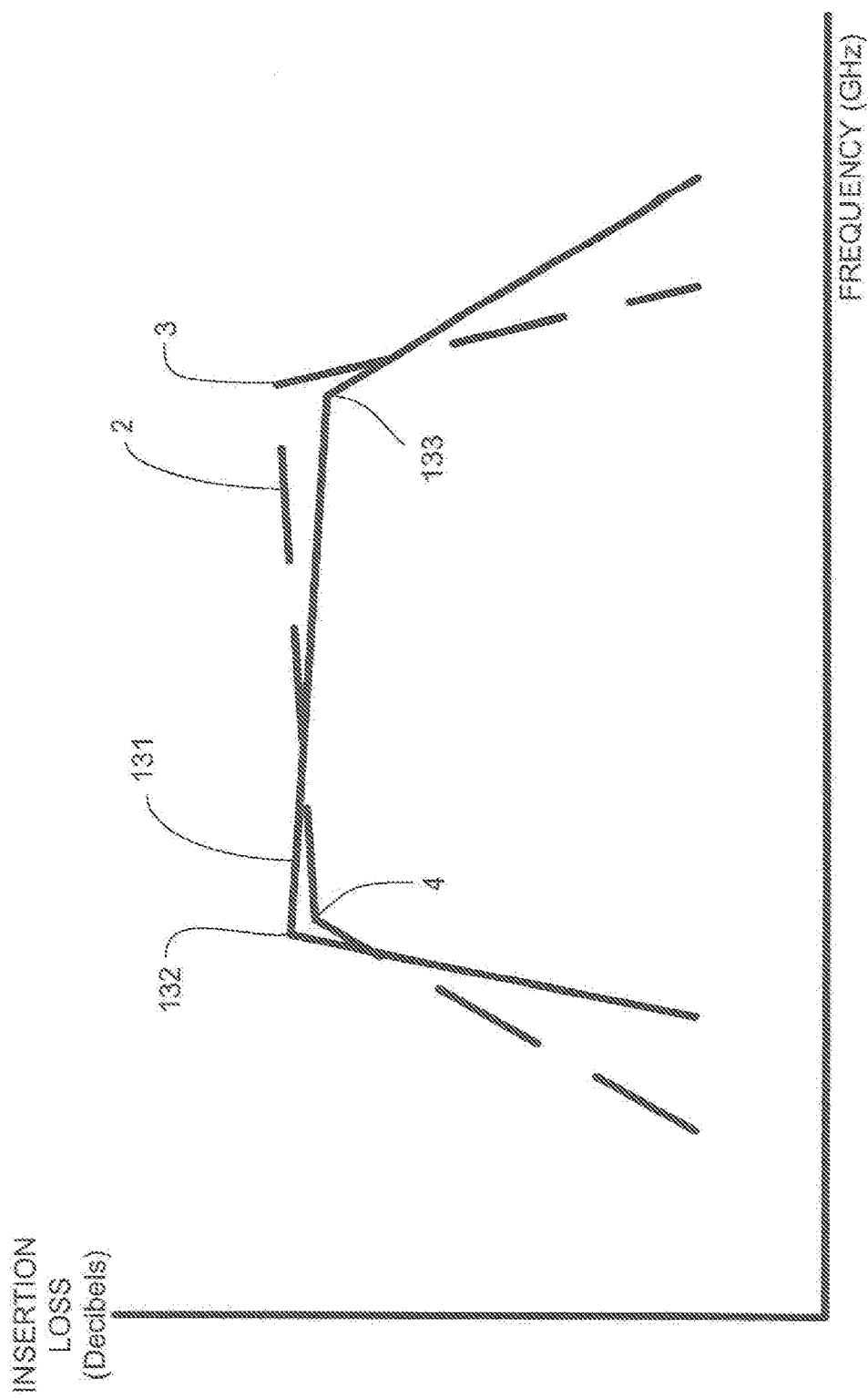
FIG. 5 is a plot of idealized insertion loss as a function of frequency for an RF filter comprising the acoustic resonator device shown in FIG. 3 overlaid with the plot shown in FIG. 1.

FIG. 5 is an idealized plot 131 of IL as a function of frequency for an RF filter comprising the acoustic resonator device 100 overlaid with the plot 2 shown in FIG. 1. One of the goals of the present inventive concepts and principles is to provide an acoustic resonator device that may yield RF filters with improved left-shoulder IL performance. As indicated above with reference to FIG. 1, the right shoulder 3 of the plot 2 is higher and has steeper roll-off than the left shoulder 4 of the plot 2 due to the $Q_P$ of the FBAR 5 being three to four times better than the $Q_{SW}$ of the FBAR 5. In contrast, the plot 131 shows that the RF filter comprising two or more of the acoustic resonator devices 100 has a left shoulder 132 that is higher and has a steeper roll-off than the right shoulder 133. The left-shoulder improvement in IL of the plot 131 corresponds to a $Q_{SW}$ that is three to four times better than the $Q_P$. In this case, the left-shoulder improvement comes at the expense of degradation in right-shoulder performance, but as indicated above, this is acceptable in many applications. A few representative embodiments of the acoustic resonator device 100 having configurations that achieve Type-1 resonance and the benefits thereof will be described with reference to FIGS. 6-9.

Figure 6:
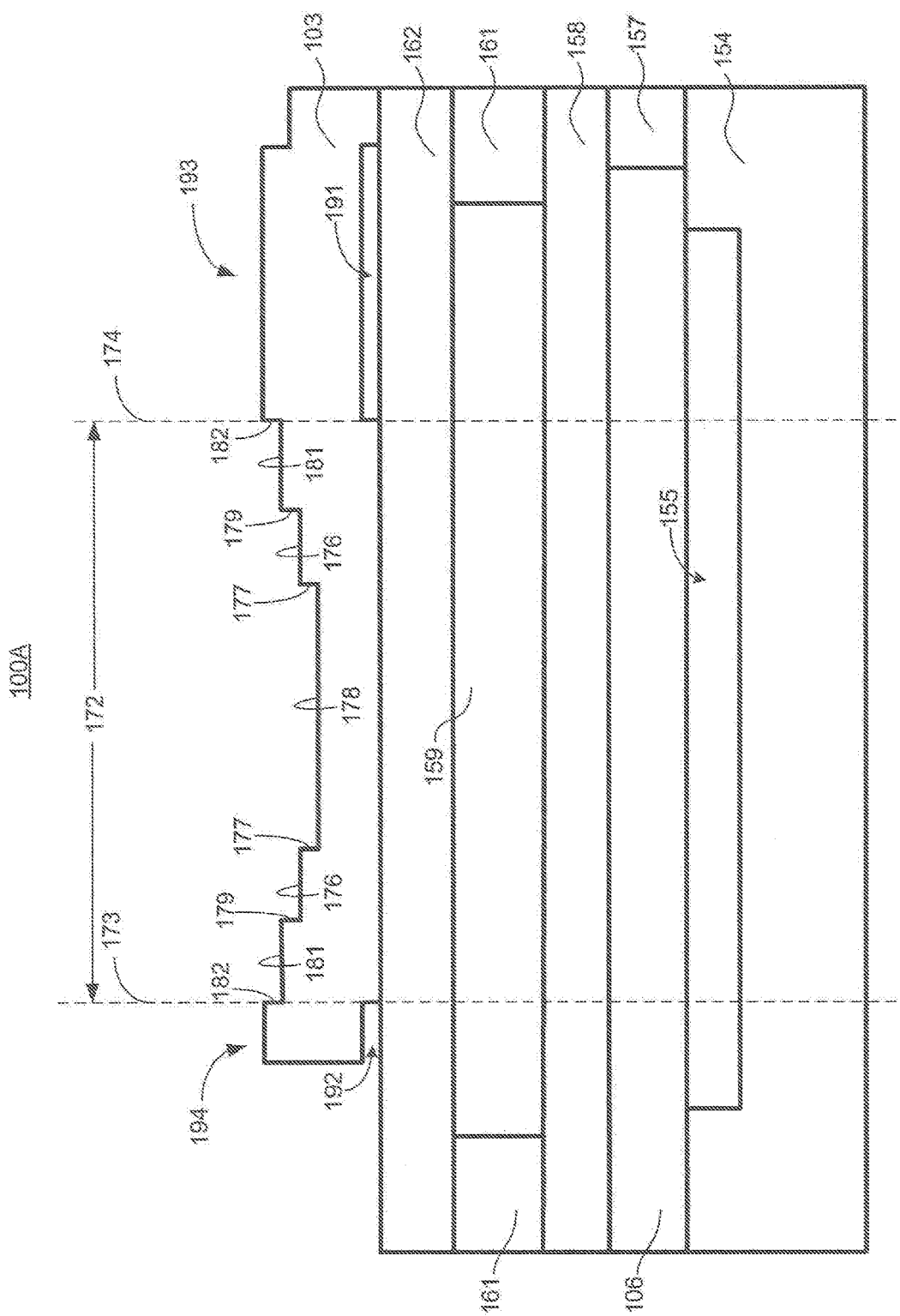
FIG. 6 is a cross-sectional view of the acoustic resonator device shown in FIG. 3 taken along line A-A' in accordance with a representative embodiment.

Referring to FIG. 6, acoustic resonator device 100A (e.g., an FBAR) comprises a substrate 154 having an air cavity 155 formed therein, a bottom electrode 106 disposed on the top surface of the substrate 154 and extending over the air cavity 155, a first planarization layer 157 disposed adjacent to bottom electrode 106 on the substrate 154, a first piezoelectric material layer 158 disposed on the top surface of the bottom electrode 106, an electrically-isolated layer of high-acoustic-impedance material 159 disposed on the top surface of the first piezoelectric material layer 158, a second planarization layer 161 disposed on the top surface of the electrically-isolated layer of high-acoustic-impedance material 159, a second piezoelectric material layer 162 disposed on the top surface of the electrically-isolated layer of high-acoustic-impedance material 159, and a top electrode 103 disposed on the top surface of the second piezoelectric material layer 162.

Collectively, bottom electrode 106, the first piezoelectric material layer 158, the electrically-isolated layer of high-acoustic-impedance material 159, the second piezoelectric material layer 162, and the top electrode 103 constitute an acoustic stack of acoustic resonator device 100A. Also, an overlap among the bottom electrode 106, the first piezoelectric material layer 158, the electrically-isolated layer of high-acoustic-impedance material 159, the second piezoelectric material layer 162, and the top electrode 103 defines a main membrane region 172 of the acoustic resonator device 100A. The main membrane region 172 extends in the lateral directions between dashed lines 173 and 174. Although not shown, a passivation layer may be present on top of top electrode 103 (in each embodiment) with thickness sufficient to insulate all layers of the acoustic stack from the environment, including protection from moisture, corrosives, contaminants, debris and the like.

In accordance with this representative embodiment, the top electrode 103 has a first metal frame 176 having inner edges 177 on first and second sides thereof that are adjacent outer edges of a central region 178 of the top electrode 103. The first metal frame 176 has outer edges 179 on the first and second sides thereof that are respective distances away from the respective inner edges 177. The first metal frame 176 has a thickness that is less than a thickness of the central region 178 of the top electrode 103. In accordance with this representative embodiment, the top electrode 103 has a second metal frame 181 that has inner edges on first and second sides thereof that correspond to the respective outer edges 179 of the first metal frame 176. The second metal frame 181 has outer edges 182 on first and second sides thereof that are respective distances away from the respective inner edges 179. The second metal frame 181 has a thickness that is greater than a thickness of the first metal frame 176.

In accordance with this representative embodiment, the acoustic resonator device 100A also has air gaps 191 and 192 in between the top electrode 103 and the second piezoelectric material layer 162 at the edges of the main membrane region. The air gaps 191 and 192 form an air bridge 193 and an air wing 194, respectively. In accordance with this embodiment, the air bridge 193 is adjacent the outer edge 182 of the second side of the second metal frame 181 and the air wing 194 is adjacent the outer edge 182 of the first side of the second metal frame 181. However, in an embodiment in which there is no second metal frame 181, the air bridge 193 is adjacent the outer edge 179 of the second side of the first metal frame 176 and the air wing 194 is adjacent the outer edge 179 of the first side of the first metal frame 176.

The first and second planarization layers 157 and 161, respectively, are made of a dielectric material (e.g., borosilicate glass (BSG)). The second planarization layer 161 surrounds the electrically-isolated layer of high-acoustic-impedance material 159 in the lateral directions and the electrically-isolated layer of high-acoustic-impedance material 159 is sandwiched in between the first and second piezoelectric material layers 158 and 162, respectively. Thus, the electrically-isolated layer of high-acoustic-impedance material 159 is electrically-isolated within the acoustic stack. The inclusion of the electrically-isolated layer of high-acoustic-impedance material 159 in between the first and second piezoelectric material layers 158 and 162, respectively, at the peak of the acoustic energy distribution of the acoustic stack modifies acoustic wave transit times in the center of the acoustic stack to facilitate Type-1 resonance, i.e., $f_{TEn} > f_{TSn+1}$. The first metal frame 176 suppresses rattle for propagating modes above $F_S$ by lowering the Mason mode amplitude above $F_S$. The second metal frame 181 and the air wing 194 suppress total motion at the edge of the active region, i.e., the main membrane region 172. The air bridge 193 suppresses the parasitic transducer effect over the top electrode connecting edge (the right side of the top electrode 103 when looking at the drawing sheet containing FIG. 6) and improves the wide-band Q factor.

The substrate 154 may be formed of a material compatible with semiconductor processes, such as silicon (Si), gallium arsenide (GaAs), indium phosphide (InP), glass, sapphire, alumina, or the like, for example. The air cavity 155 may be formed by etching a cavity in the substrate 154 and filling the etched cavity with a sacrificial material, such as phosphosilicate glass (PSG), for example, which is subsequently removed to leave an air space. Various illustrative fabrication techniques for an air cavity in a substrate are described by U.S. Pat. No. 7,345,410 (Mar. 18, 2008), to Grannen et al., which is hereby incorporated by reference in its entirety.

The bottom electrode 106 may be formed of one or more electrically conductive materials, such as various metals compatible with semiconductor processes, including tungsten (W), molybdenum (Mo), iridium (Jr), aluminum (Al), platinum (Pt), ruthenium (Ru), niobium (Nb), or hafnium (Hf), for example. In various configurations, the bottom electrode 106 may be formed of two or more layers of electrically conductive materials, which may by the same as or different from one another. Likewise, the top electrode 103 may be formed of electrically conductive materials, such as various metals compatible with semiconductor processes, including tungsten (W), molybdenum (Mo), iridium (Jr), aluminum (Al), platinum (Pt), ruthenium (Ru), niobium (Nb), or hafnium (Hf), for example. In various configurations, the top electrode 103 may be formed of two or more layers of electrically conductive materials, which may by the same as or different from one another. Also, the configuration and/or the material(s) forming the top electrode 103 may be the same as or different from the configuration and/or the material(s) forming the bottom electrode 106.

The first and second piezoelectric material layer 158 and 162, respectively, may be formed of any piezoelectric material compatible with semiconductor processes, such as aluminum nitride (AlN), zinc oxide (ZnO), or zirconate titanate (PZT), for example. Of course, other materials may be incorporated into the above and other features of acoustic resonator device 100A (as well as the other acoustic resonator described herein) without departing from the scope of the present teachings. Also, in various embodiments, the first and second piezoelectric material layers 158 and 162 may be "doped" with at least one rare earth element, such as scandium (Sc), yttrium (Y), lanthanum (La), or erbium (Er), for example, to increase the piezoelectric coupling coefficient $e_{33}$ in the first and second piezoelectric material layers 158 and 162. Examples of doping piezoelectric material layers with one or more rare earth elements for improving electromechanical coupling coefficient $Kt^2$ are provided by U.S. Pat. No. 9,225,313 to Bradley et al. and U.S. Pat. No. 9,136,819 to Grannen et al., which are hereby incorporated by reference in their entireties. Of course, doping piezoelectric material layers with one or more rare earth elements may be applied to any of various embodiments, including the embodiments described below with reference to FIGS. 7-9.

The electrically-isolated layer of high-acoustic-impedance material 159 is typically made of a metal, such as, for example, W or Ir, but may also be made of a dielectric material having a suitably high acoustic impedance. In cases where a metal such as W or Ir is used for this purpose, it forms a floating metal interposer within the acoustic stack.

The first and second metal frames 176 and 181, respectively, may be formed of one or more conductive materials, such as copper (Cu), molybdenum (Mo), aluminum (Al), tungsten (W), for example.

Figure 7:
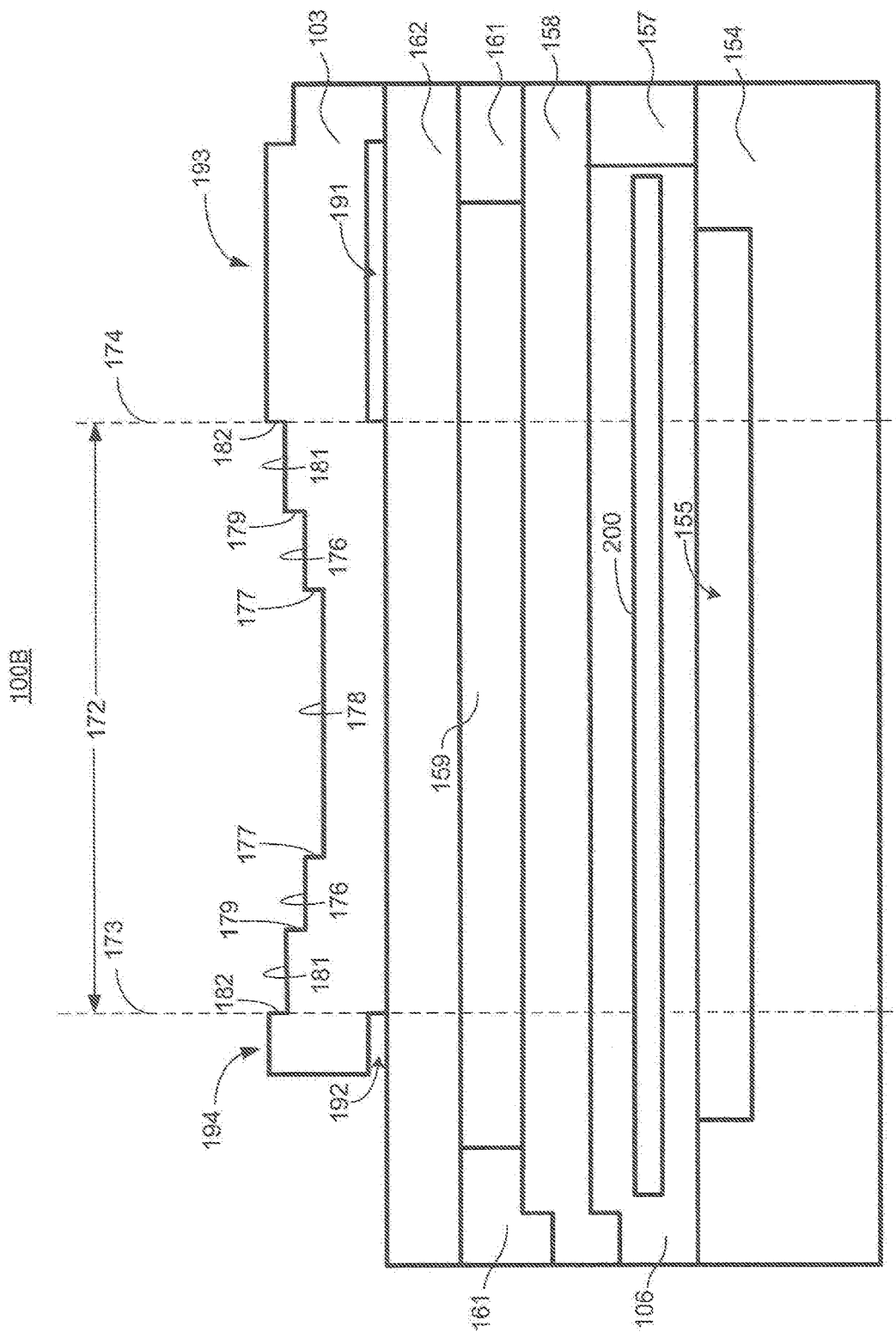
FIG. 7 is a cross-sectional view of the acoustic resonator device shown in FIG. 3 taken along line A-A' in accordance with another representative embodiment.

Referring to FIG. 7, acoustic resonator device 100B (e.g., an FBAR) is identical to the acoustic resonator device 100A except that the bottom electrode 106 has a temperature compensating layer 200 embedded therein that extends across the main membrane region 172 of the acoustic stack. The temperature compensating layer 200 may be formed of an oxide material, such as boron silicate glass (BSG) or tetraethyl orthosilicate (TEOS), for example, having a positive temperature coefficient that offsets at least a portion of negative temperature coefficients of the first and/or second piezoelectric material layers 158 and 162, respectively, and the conductive material in the bottom and top electrodes 106 and 103, respectively. As used herein, a material having a "positive temperature coefficient" means that the material has a positive temperature coefficient of elastic modulus over a certain temperature range. Similarly, a material having a "negative temperature coefficient," as used herein, means the material has a negative temperature coefficient of elastic modulus over the same temperature range. Various illustrative temperature compensating features are described by Burak et al. in U.S. Pat. No. 9,444,426, which is hereby incorporated by reference herein in its entirety. Embedding the temperature compensating layer 200 (which usually has a low-acoustic impedance) in the bottom electrode 106 makes the energy distribution across the center of the acoustic stack more asymmetrical, which, in turn, helps to facilitate the conversion from Type-II to Type-I resonance, as will be appreciated by one skilled in the art.

Figure 8:
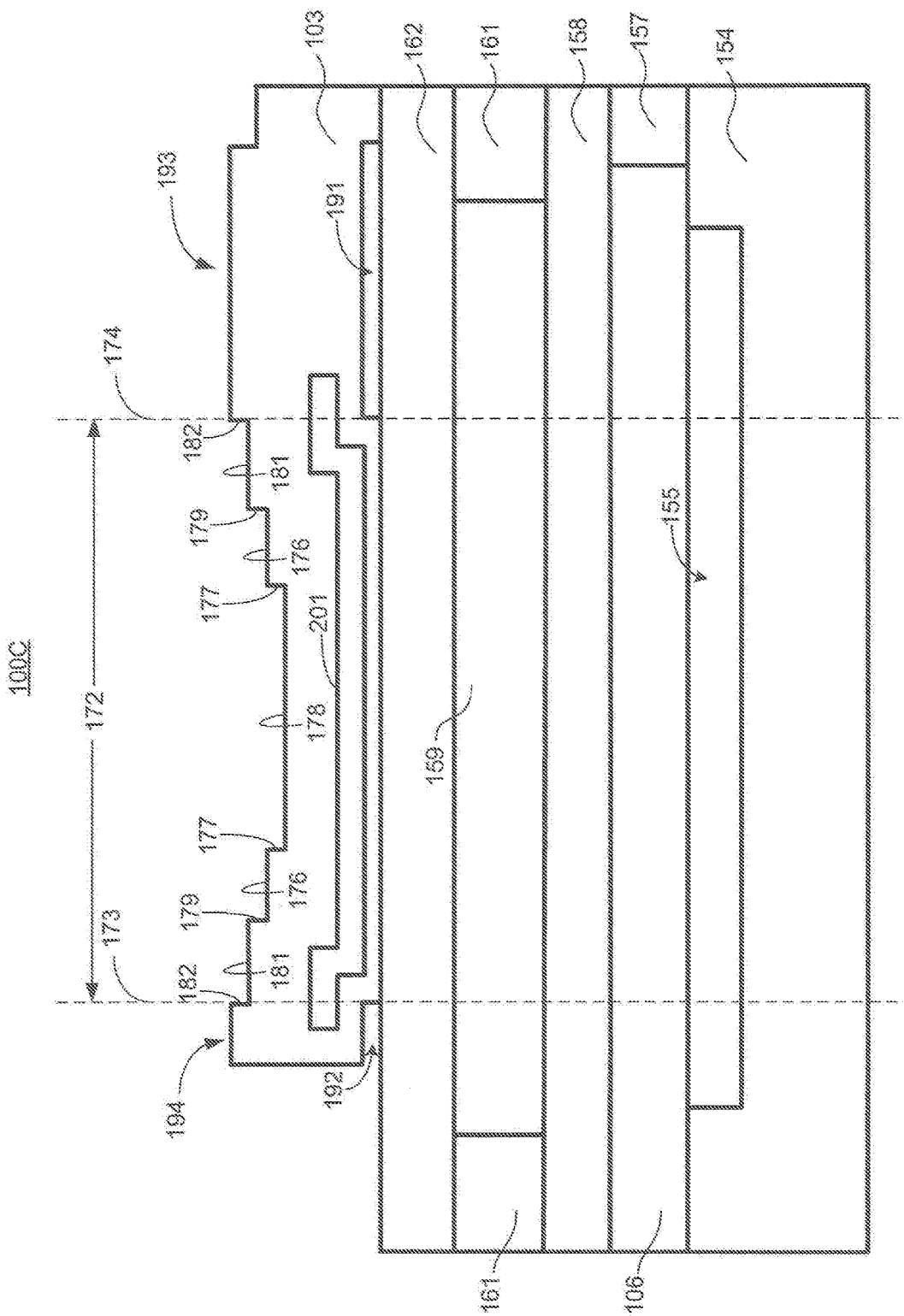
FIG. 8 is a cross-sectional view of the acoustic resonator device shown in FIG. 3 taken along line A-A' in accordance with another representative embodiment.

Referring to FIG. 8, acoustic resonator device 100C (e.g., an FBAR) is identical to the acoustic resonator device 100A except that the top electrode 103 has a temperature compensating layer 201 embedded therein that extends across, i.e., overlaps, the main membrane region 172 of the acoustic stack. The temperature compensating layer 201 may be, for example, boron silicate glass mentioned above. Embedding the temperature compensating layer 201 in the top electrode 103 has generally the same effect and benefits described above that are obtained by embedding the temperature compensating layer 200 in the bottom electrode 106.

Figure 9:
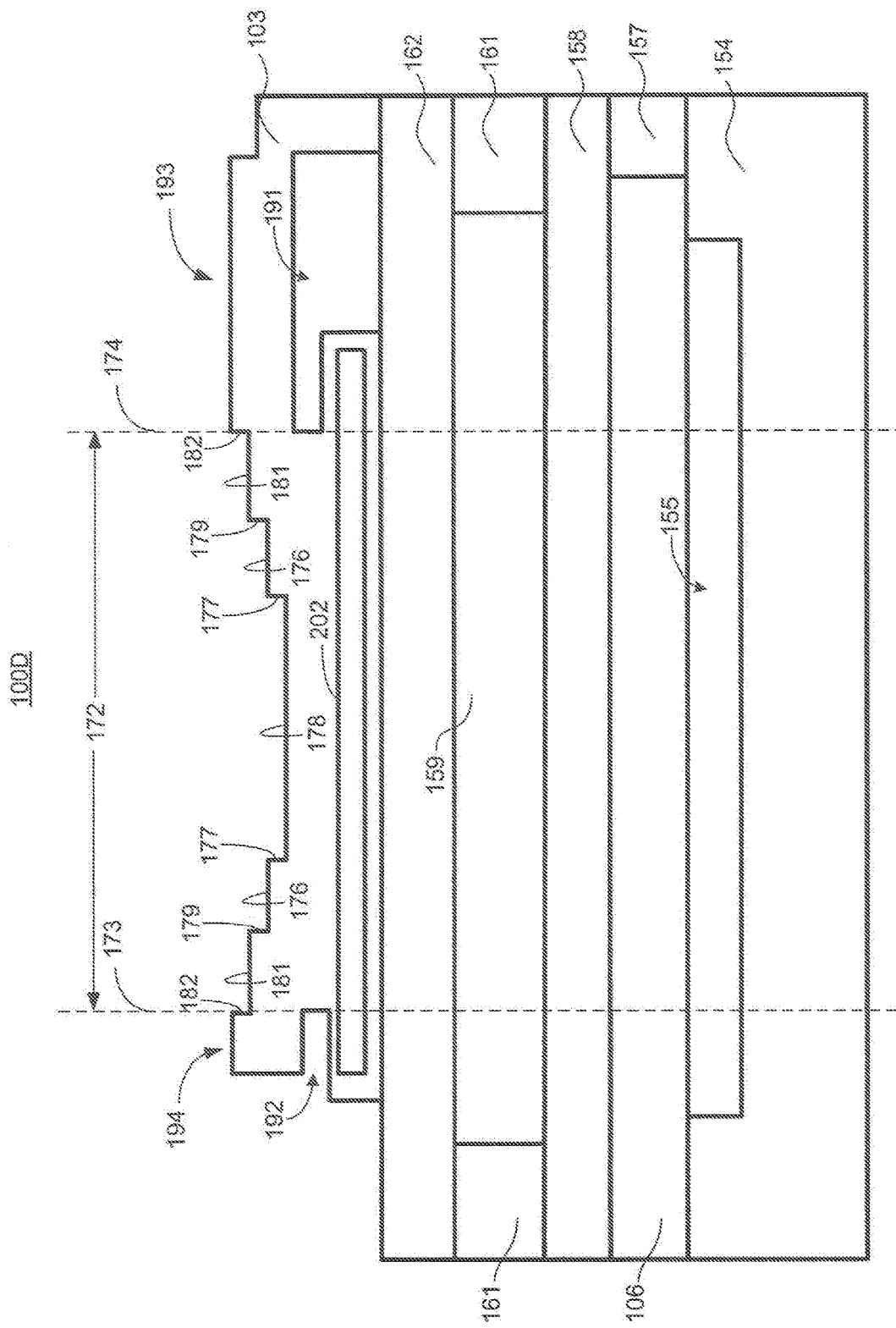
FIG. 9 is a cross-sectional view of the acoustic resonator device shown in FIG. 3 taken along line A-A' in accordance with another representative embodiment.

Referring to FIG. 9, the acoustic resonator device 100D (e.g., an FBAR) is identical to the acoustic resonator device 100C except that the cross-section of top electrode 103 has been varied to allow a temperature compensating layer of 202 that is flat to be embedded therein in a structure that extends across, i.e., overlaps, the main membrane region 172 of the acoustic stack. In the representative embodiment shown in FIG. 8, the temperature compensating layer 201 is bent to conform to the air bridge 193 and air wing 194. There are risks that this can cause the portions of the top electrode 103 that form the air bridge 193 or the air wing 194 to fracture and that terminating the temperature compensating layer 201 in the air bridge 193 or air wing 194 may lead to worsened energy confinement acoustics. Modifying the cross-sectional shape of the top electrode 103 so that the flat temperature compensating layer 202 is beneath rather than on top of the air bridge 193 and air wing 194 eliminates, or at least reduces, these risks. Embedding the temperature compensating 202 in the top electrode 103 has generally the same effect and benefits described above that are obtained by embedding the temperature compensating layer 200 in the bottom electrode 106.

It should be noted that while all of the acoustic resonator devices 100A-100D shown in FIGS. 6-9, respectively, exhibit Type-1 resonance and achieve the benefits described above, the present teachings are not limited to the configurations shown in FIGS. 6-9. Other acoustic resonator device configurations that are designed consistent with the present teachings to achieve Type-1 resonance are within the scope of the present teachings, as will be understood by those of skill in the art in view of the description provided herein. For example, while the acoustic resonator devices 100A-100D have been described as having first and second metal frames 176 and 181, respectively, an acoustic resonator device in accordance with the present teachings may have a single frame. As another example, an acoustic resonator device in accordance with the present teachings may not include the air bridge 193 and/or the air wing 194.

While example embodiments are disclosed herein, one of ordinary skill in the art will appreciate that many variations that are in accordance with the present teachings are possible and remain within the scope of the appended claims. For instance, as indicated above, the location, dimensions, materials and even numbers of frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

What is claimed is:

1. An acoustic resonator device, comprising:
   a bottom electrode disposed on a substrate over an air cavity;
   a first piezoelectric material layer disposed on the bottom electrode;
   an electrically-isolated layer of high-acoustic-impedance material disposed on the first piezoelectric material layer;
   a second piezoelectric material layer disposed on the electrically-isolated layer of high-acoustic-impedance material;
   a top electrode comprising at least one air wing disposed on the first piezoelectric material layer, wherein an overlap among the top electrode, the first piezoelectric material layer, the second piezoelectric material layer, the electrically-isolated layer of high-acoustic-impedance material, the bottom electrode, and the air cavity defines a main membrane region, and at least one air bridge exists in the top electrode, wherein the at least one air wing is disposed opposite the air bridge;
   a first metal frame on a top surface of the top electrode outside of a central region of the top electrode, the first metal frame having a first side and a second side, the first side being opposite the second side, the first metal frame having a thickness that is greater than a thickness of the top electrode in the central region of the top electrode, the first side of the first metal frame having a inner edge that is adjacent an outer edge of the central region of the top electrode and having and outer edge that is a distance away from the inner edge of the first side of the first metal frame, the second side of the first metal frame having an inner edge that is adjacent an outer edge of the central region of the top electrode and having an outer edge that is a distance away from the inner edge of the second side of the first metal frame; and
   a temperature compensating layer disposed within the bottom electrode, or within the top electrode.

2. The acoustic resonator device of claim 1, wherein during operation the acoustic resonator device operates at a thickness extensional (TE) resonant frequency, $f_{TE}$, and has a thickness shear (TS) resonant frequency, $f_{TS}$, and wherein $f_{TEn}$ is greater than $f_{TSn+1}$, where n is an order of a resonance.

3. The acoustic resonator device of claim 1, further comprising:
   a second metal frame on the top surface of the top electrode, the second metal frame having a thickness that is greater than a thickness of the first metal frame, the second metal frame having a first side and a second side, the first side of the second metal frame having an inner edge that is adjacent the outer edge of the first side of the first metal frame and having an outer edge that is a distance away from the inner edge of the first side of the second metal frame, the second side of the second metal frame having an inner edge that is adjacent the outer edge of the second side of the first metal frame and having an outer edge that is a distance away from the inner edge of the second side of the second metal frame.

4. The acoustic resonator device of claim 3, wherein the second metal frame has a thickness that is greater than the thickness of the first metal frame.

5. The acoustic resonator device of claim 1, wherein the air bridge is adjacent the outer edge of the second side of the first metal frame.

6. The acoustic resonator device of claim 1, wherein the air wing is adjacent the outer edge of the first side of the first metal frame.

7. The acoustic resonator device of claim 1, wherein the temperature compensating layer comprises boron silicate glass (BSG).

8. The acoustic resonator device of claim 1, wherein the temperature compensating layer comprises tetraethyl orthosilicate (TEOS).

9. The acoustic resonator device of claim 1, wherein the temperature compensating layer overlaps the main membrane region.

10. The acoustic resonator device of claim 9, wherein the temperature compensating layer overlaps the air bridge and the air wing.

11. The acoustic resonator device of claim 1, wherein the temperature compensating layer comprises boron silicate glass (BSG).

12. The acoustic resonator device of claim 1, wherein the temperature compensating layer comprises tetraethyl orthosilicate (TEOS).

13. The acoustic resonator device of claim 1, wherein the temperature compensating layer overlaps the main membrane region.

14. The acoustic resonator device of claim 13, wherein the temperature compensating layer extends into the air bridge and the air wing.

15. An acoustic resonator device, comprising:
   a bottom electrode disposed on a substrate over an air cavity;
   a temperature compensating layer disposed within the bottom electrode;
   a first piezoelectric material layer disposed on the bottom electrode;
   an electrically-isolated layer of high-acoustic-impedance material disposed on the first piezoelectric material layer;
   a second piezoelectric material layer disposed on the electrically-isolated layer of high-acoustic-impedance material; and a top electrode disposed on the first piezoelectric material layer, wherein an overlap among the top electrode, the first piezoelectric material layer, the second piezoelectric material layer, the electrically-isolated layer of high-acoustic-impedance material, the bottom electrode, and the air cavity defines a main membrane region.

16. The acoustic resonator device of claim 15, wherein the temperature compensating layer comprises boron silicate glass (BSG).

17. The acoustic resonator device of claim 15, wherein the temperature compensating layer comprises tetraethyl orthosilicate (TEOS).

18. The acoustic resonator device of claim 15, wherein the temperature compensating layer overlaps the main membrane region.

19. An acoustic resonator device, comprising:
a bottom electrode disposed on a substrate over an air cavity;
a first piezoelectric material layer disposed on the bottom electrode;
an electrically-isolated layer of high-acoustic-impedance material disposed on the first piezoelectric material layer;
a second piezoelectric material layer disposed on the electrically-isolated layer of high-acoustic-impedance material;
a top electrode disposed on the first piezoelectric material layer, wherein an overlap among the top electrode, the first piezoelectric material layer, the second piezoelectric material layer, the electrically-isolated layer of high-acoustic-impedance material, the bottom electrode, and the air cavity defines a main membrane region; and
a temperature compensating layer disposed within the top electrode.

20. The acoustic resonator device of claim 19, wherein the temperature compensating layer comprises boron silicate glass (BSG).

21. The acoustic resonator device of claim 19, wherein the temperature compensating layer comprises tetraethyl orthosilicate (TEOS).

22. The acoustic resonator device of claim 19, wherein the temperature compensating layer overlaps the main membrane region.

* * * * *